United States Patent [19]
Naughton

[11] Patent Number: 5,925,822
[45] Date of Patent: Jul. 20, 1999

[54] MICROELECTROMECHANICAL CANTILEVER ACOUSTIC SENSOR

[75] Inventor: Michael J. Naughton, Buffalo, N.Y.

[73] Assignees: Michael Naughton, Norwood, Mass.; Murali Chaparala, Charlottesville, Va.

[21] Appl. No.: 09/026,260

[22] Filed: Feb. 19, 1998

Related U.S. Application Data

[63] Continuation-in-part of application No. 08/640,101, Apr. 30, 1996, Pat. No. 5,739,686.

[51] Int. Cl.$^6$ .................................................. G01H 11/06

[52] U.S. Cl. .............................. 73/628; 73/632; 367/103

[58] Field of Search .............................. 73/584, 594, 596, 73/627, 628, 629, 651, 654, 632, 514.36, 514.37, 514.32, 514.33; 367/103

[56] References Cited

U.S. PATENT DOCUMENTS

| | | | |
|---|---|---|---|
| 4,429,575 | 2/1984 | Akishika | 73/598 |
| 5,077,697 | 12/1991 | Chang | 367/48 |
| 5,357,063 | 10/1994 | House et al. | 367/68 |
| 5,412,988 | 5/1995 | Neff et al. | 73/514.36 |
| 5,563,848 | 10/1996 | Rogers et al. | 367/99 |
| 5,808,969 | 9/1998 | Arnaud et al. | 73/594 |

*Primary Examiner*—John E. Chapman
*Attorney, Agent, or Firm*—Notaro & Michalos P.C.

[57] ABSTRACT

A microelectromechanical sensor for detecting acoustic signals propagating through the ground, including reflected signals, has a cantilever provided with capacitance measurement to detect deflection or twisting of the cantilever due to the presence of acoustic signals. The cantilever size and shape may be changed to increase sensitivity to a particular frequency. An array of sensors may be used to detect buried objects, such as land mines.

11 Claims, 8 Drawing Sheets

MICROELECTROMECHANICAL CANTILEVER ACOUSTIC SENSOR

CROSS-REFERENCE TO RELATED APPLICATIONS

This application is a continuation-in-part of U.S. patent application Ser. No. 08/640,101, filed Apr. 30, 1996, now U.S. Pat. No. 5,739,686, which application is hereby incorporated in its entirety by reference.

FIELD AND BACKGROUND OF THE INVENTION

The present invention relates generally to the field of acoustic wave detection and in particular to a new and useful microelectromechanical sensor using cantilever capacitance or piezoresistance to indicate the presence of acoustic wave energy. In particular, the device can be used to sense acoustic signals propagating through the earth, including reflected signals from buried objects having different densities from the surrounding soil.

Microelectromechanical sensors are known for use in sensing the presence or strength of magnetic fields, among other things. The sensors use a differential or change in electrical capacitance or piezoresistance to measure magnetic fields they are exposed to, or measure the magnetic properties of sample crystals in contact with the sensor exposed to a known magnetic field.

Recent developments in acoustics indicate that some types of acoustic signals called solitons can be made to propagate through the earth with little distortion. See, Surajit Sen et al., "Soliton-like Pulses in Perturbed and Driven Hertzian Chains and their Possible Applications in Detecting Buried Impurities," Physica Review E, Vol. 57, No. Feb. 2, 1998; Ellen Goldbaum, "UB method may help detect land mines" UB Reporter, Dec. 4, 1997 at p.2. While this work is primarily theoretical, there is support for the concept and physical experiments have indicated that solitons exist.

Sensors having the sensitivity necessary to detect acoustic signals reflected from small buried objects have heretofore been unknown.

The ability to sense any type of acoustic signals reflected from objects buried in dirt, soil or sand is particularly useful for the task of finding and removing land mines. Land mines are commonly made cheaply and inexpensively from non-metallic materials which cannot be easily detected using current technology. They are typically buried less than a few feet below the surface, however, so that a person may detonate the mine by stepping on the ground above it.

Common methods for eliminating land mines from large areas include bombing the region suspected of having land mines to detonate the buried mines, or, when available, using maps indicating the mine locations to find and remove them. Neither method is particularly reliable and subject to error, either by failing to detonate a mine, or through differences between the map location and the actual mine position.

Thus, a relatively inexpensive, portable sensor system for detecting at least non-metallic objects buried in close proximity to the surface of the earth is desirable.

SUMMARY OF THE INVENTION

It is an object of the present invention to provide a microelectromechanical sensor that makes cantilever capacitance or peizoresistance measurements of the amplitudes of acoustic signals.

It is a further object of the invention to provide a microelectromechanical sensor which is tuned to be very sensitive to a particular frequency or range of frequencies of acoustic signals.

Another object of the invention is to provide a sensor array which may be used over a wide area to detect buried objects.

Accordingly, a microelectromechanical sensor has a cantilever sensitive to a range of frequencies of acoustic signals. The cantilever arm deflects or twists in the presence of acoustic signals. The amplitudes of the acoustic signals detected are converted to an electrical capacitance measurement between the cantilever and a metallized plate. The capacitance measurement may be displayed on a simple meter, or on a more elaborate display.

Alternatively, piezoresistance measurements of strain induced in the cantilever neck in a strain sensitive material by vibrations from a sensed acoustic signal may be used to translate the sensed acoustic signals for display on a meter or more elaborate display.

Several microelectromechanical sensors may be arranged in two- or three-dimensional arrays in order to use triangulation of sources to accurately determine the location of a buried object, such as a land mine, by plotting the capacitance or piezoresistance measurements caused by an acoustic signal received at each location.

A single transducer for generating a particular frequency of acoustic signal may be provided, or each microelectromechanical sensor may have a transducer operating at the same or different frequencies. The transducers may be used with a single microelectromechanical sensor, or with an array. The microelectromechanical sensors can detect reflected frequencies indicating an object having different density from the earth.

The microelectromechanical sensor cantilever is constructed of a dielectric substrate with an electrically insulating coating on the top surface of the substrate. Conducting layers are etched or deposited on the top and bottom surfaces of the cantilever. The bottom conducting layer forms a capacitor upper plate with a capacitance gap between the upper plate and a metallized plate forming the capacitor lower plate. The top conducting layer may consist of nulling loops and/or a strain gauge loop. Adhesion layers may be provided between the conducting layers and the substrate and insulating coating. A bridge circuit and lock-in amplifier for isolating a particular frequency are used to measure the capacitance change response.

When piezoresistance measurements are used with the cantilever, a loop of strain-sensitive material is deposited as the top conducting layer of the cantilever. Differences in resistance in the loop due to deflections or strains induced in the cantilever are measured by a strain gauge in combination with a lock-in amplifier.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

Figure 1:
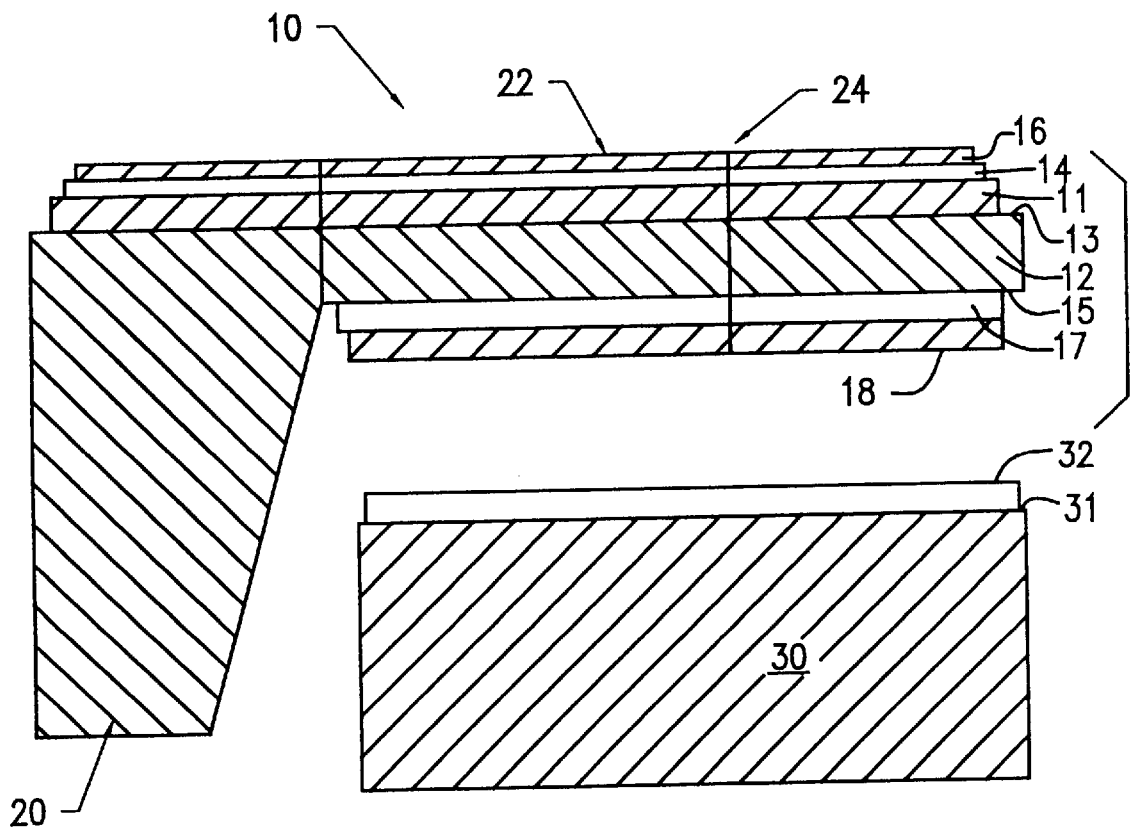
FIG. 1 is a sectional view, partly in side elevation, of a microelectromechanical sensor cantilever element of the invention.

Turning now to the drawings, FIG. 1 shows a cantilever, generally designated 10, placed in proximity to a block 30.

Cantilever 10 is an integrated piece of layered materials. A dielectric substrate 12 forms the basic shape of the cantilever 10. A base 20 is connected to measurement platform 24 by an elongate neck 22. The base 20 and platform 24 are both rectangular in plan, while base 20 of substrate 12 is thicker than either platform 24 or neck 22. Suitable thicknesses for the base 20, and neck 22 and platform 24, are 250 µm and 5 µm, respectively. Neck 22 is narrower than both base 20 and platform 24 and is capable of only vertical motion.

The remaining layers are directly or indirectly adhered to either the top surface 13 or bottom surface 15 of the substrate 12.

Top surface 13 of substrate 12 may have a coating of insulating material 11 applied. An adhesion layer 14 of a non-magnetic metal contacts insulating material 11. Finally, a top conducting layer 16 is deposited onto adhesion layer 14.

Bottom surface 15 of substrate 12 is covered by a second adhesion layer 17 of a similar material as adhesion layer 14. A bottom conducting layer 18 is deposited onto adhesion layer 17. While not shown in FIG. 1, a portion of bottom conducting layer 18 may extend onto base 20 of substrate 12, as shown as lead 51 in FIG. 4. An acceptable thickness for bottom conducting layer 18 is 50 nm.

The substrate 12 is preferably made of silicon, with insulator 11 being silicon nitride ($Si_3N_4$). Alternatively, substrate 12 and insulator layer 11 may be a single substrate 12 of silicon, or another dielectric, such as the commercially available polymer KAPTON (made by DuPont), or other non-conducting polyimide. The substrate is made 4500 nm thick in a preferred embodiment. When insulator layer 11 is used, it can be about 10 nm thick.

Adhesion layers 14, 17 are preferably made of titanium, although other non-magnetic materials are suitable, such as chromium. The conducting layers 16, 18 are gold or other good conducting metal which is easily etched or deposited onto adhesion layers 14, 17. A preferred thickness for each of the adhesion layers is 3 nm.

Block 30 has top surface 31 which supports metallized plate 32. Block 30 is placed a distance away from cantilever 10 so as to produce a capacitance gap between metallized plate 32 and bottom conducting layer 18. The gap is preferably between 10 and 100 µm, although larger and smaller gaps may be used. The block 30 can be made of any non-magnetic insulator, such as glass. Metallized plate 32 is a good conductor, such as gold or copper. A contact connection 52 is provided on plate 32 for connecting the plate to one side of a capacitance bridge circuit 50.

Figure 5:
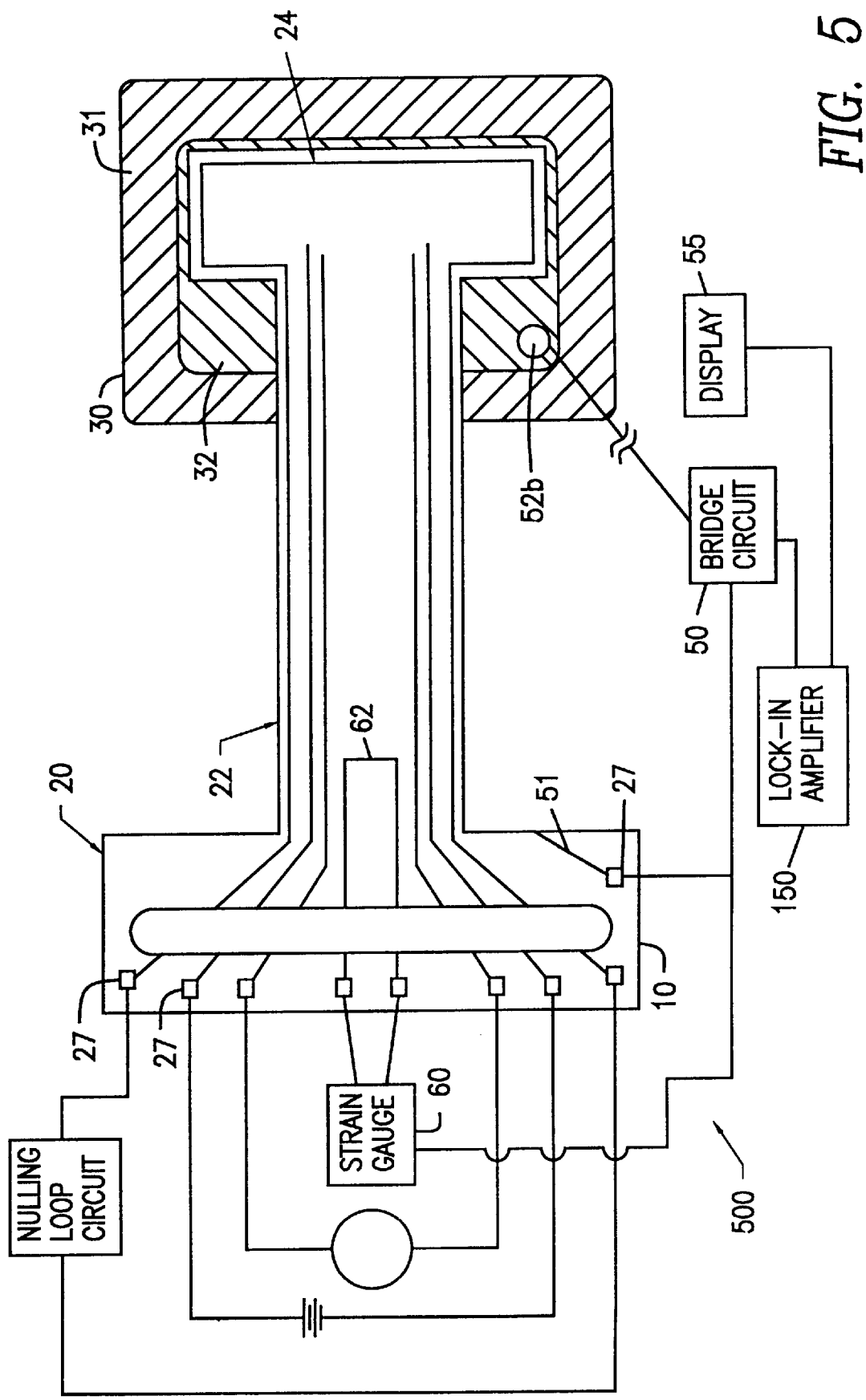
FIG. 5 is an electromechanical schematic top plan view of a single cantilever element.

Particular electrical circuits etched or deposited as top conducting layer 16 that can be used with cantilever 10 are shown in FIG. 5. An acceptable thickness for the top conducting layer is 100 nm.

Strain gauge 60 is connected to the contacts 27 of strain loop 62. Strain loop 62 extends onto neck 22 from base 20 near the center of the base 20. Strain loop 62 is also a single loop of parallel leads of a piezoactive material.

Figure 4:
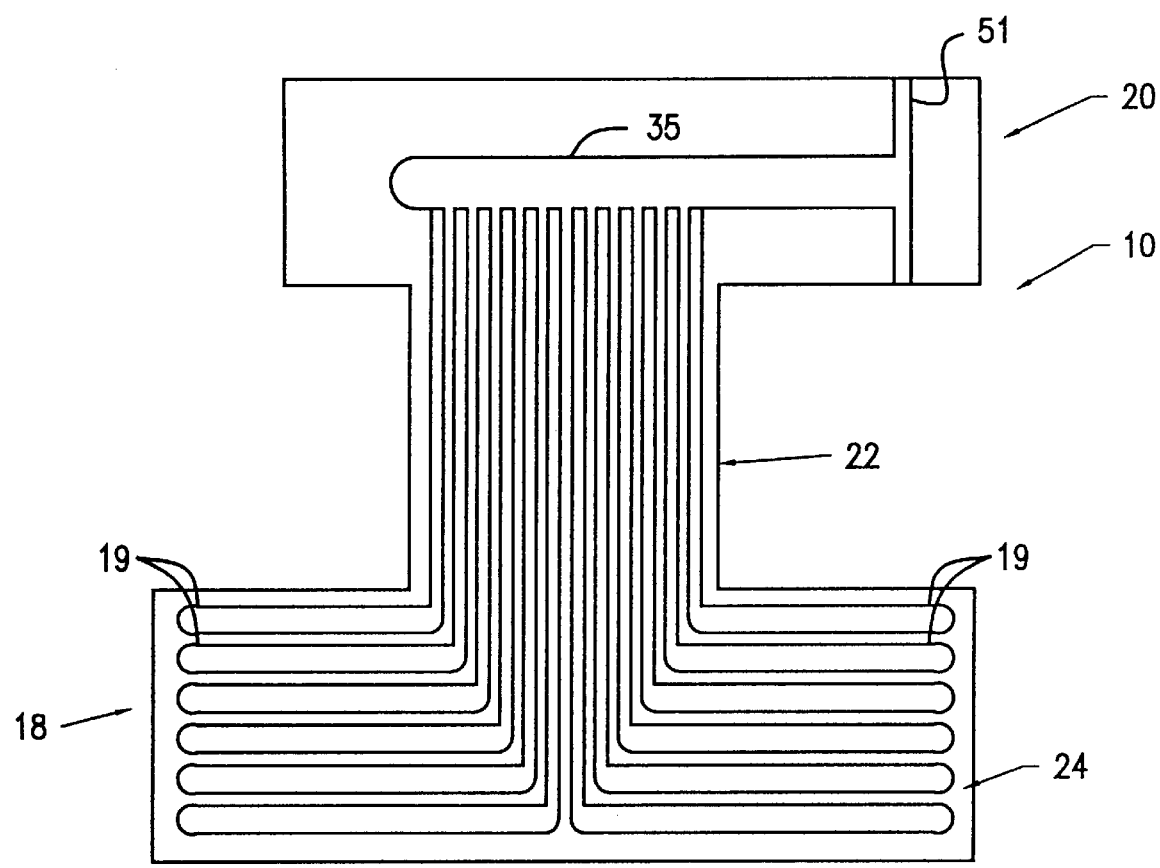
FIG. 4 is a bottom plan view of the cantilever element of FIG. 1.

Capacitor plate lead 51 connects the L-shaped capacitor electrode leads 19 and capacitor electrode bus 35 of the bottom conductive layer 18, as shown in FIG. 4, to a contact 27 on the top conductive layer 16. Lead 51 is connected via contact 27 to the other side of capacitor bridge circuit 50. The purpose of the particular pattern of electrode leads 19 is to minimize eddy current effects.

Capacitor bridge circuit 50 may be any known capacitance bridge circuit, such as a Wheatstone bridge, which has a sensitivity of at least $10^{-4}$ pF. The display 55 indicates the output of lock-in amplifier 150 and can be a simple analog meter or a digital display. Commercially available bridges include General Radio GR 1615 and Andeen Hagerling 2500A bridges.

When an acoustic signal having an appropriate frequency is present, it will cause the measurement platform of the cantilever 10, the platform 24 to rotate, or deflect.

In the capacitance mode, the deflection causes the capacitance of the capacitor formed by the bottom conductive layer 18 (capacitor electrode leads 19) of the cantilever 10, which forms the top plate of the capacitor, and the metallized plate 32, which forms the bottom plate, to change as the gap between the two plates increases or decreases. This change can be measured using bridge circuit 50. Bridge circuit 50 includes a driving amplifier and may be used in either a capacitance or resistance mode. Lock-in amplifier 150 is connected to the bridge circuit for selecting a particular frequency to analyze. The lock-in amplifier 150 may be of any known type which can be used to select frequencies in the acoustic range, such as the EGG/PAR model 5210 or the Stanford Research Systems model SR850. The lock-in amplifier 150 permits a user to scan for the presence or absence of a particular reflected frequency with the cantilever 10, and may be stepped through a series of frequencies to selectively scan a range.

Since acoustic signals generate a vibration, or oscillation in the cantilever, a single, constant capacitance is not measured. Rather, the DC output of the capacitance has several AC components at different frequencies. The lock-in amplifier 150 permits specific frequencies to be sampled and measured, thereby providing a capacitance change at a particular frequency in response to a sensed acoustic signal.

The change in capacitance can usually be measured accurately, with resolution to about 1 to 10 aF. A typical equilibrium capacitance, that is, the capacitance in the absence of any acoustic signal is about 0.1 to 1 pF.

The change in capacitance, $\Delta C$, will be directly related to the amplitude of the acoustic signal causing the platform 24 to deflect. This assumes that a harmonic restoring force according to Hooke's law governs the mechanical response of the cantilever 10. The harmonic approximation can be used if the deflection of the cantilever measurement platform 24, $\Delta d$, is small; for a small $\Delta d$, the torque $\tau$ is proportional to $\Delta d$. The $\Delta C$ is proportional to $\Delta d/(d(d+\Delta d))$, and the torque, τ, is therefore linearly proportional to the capacitance change ΔC to first order. This results in the ΔC being directly proportional to the magnitude of the acoustic signal causing the deflection of the cantilever platform 24.

An alternate circuit for measuring the deflection Δd uses the piezoactive strain loop 62 and strain gauge 60. This embodiment places the strain loop at the point on the neck 22 most susceptible to stress when the cantilever 10 deflects. The strain gauge 60 is used to determine when the cantilever deflects and provides a relative amplitude of the acoustic signal detected by the deflection. The material used for the strain loop 62 is sensitive to deflections or twist in that it exhibits a change in resistance which may be measured by applying a constant current or voltage and measuring the difference in the resulting voltage or current, respectively.

Similarly to the capacitance measurement, the change in resistance ΔR is proportionate to Δd/(d(d+Δd)). Thus the ΔR (or ΔI) is also proportional to the magnitude of an acoustic signal that causes a deflection or twist in the cantilever 10.

When piezoresistance is used to sense acoustic signals, bridge circuit 50, lock-in amplifier 150 and display 55 are used in a manner similar to the capacitance mode, except the bridge circuit 50 becomes a resistance bridge.

Figure 6:
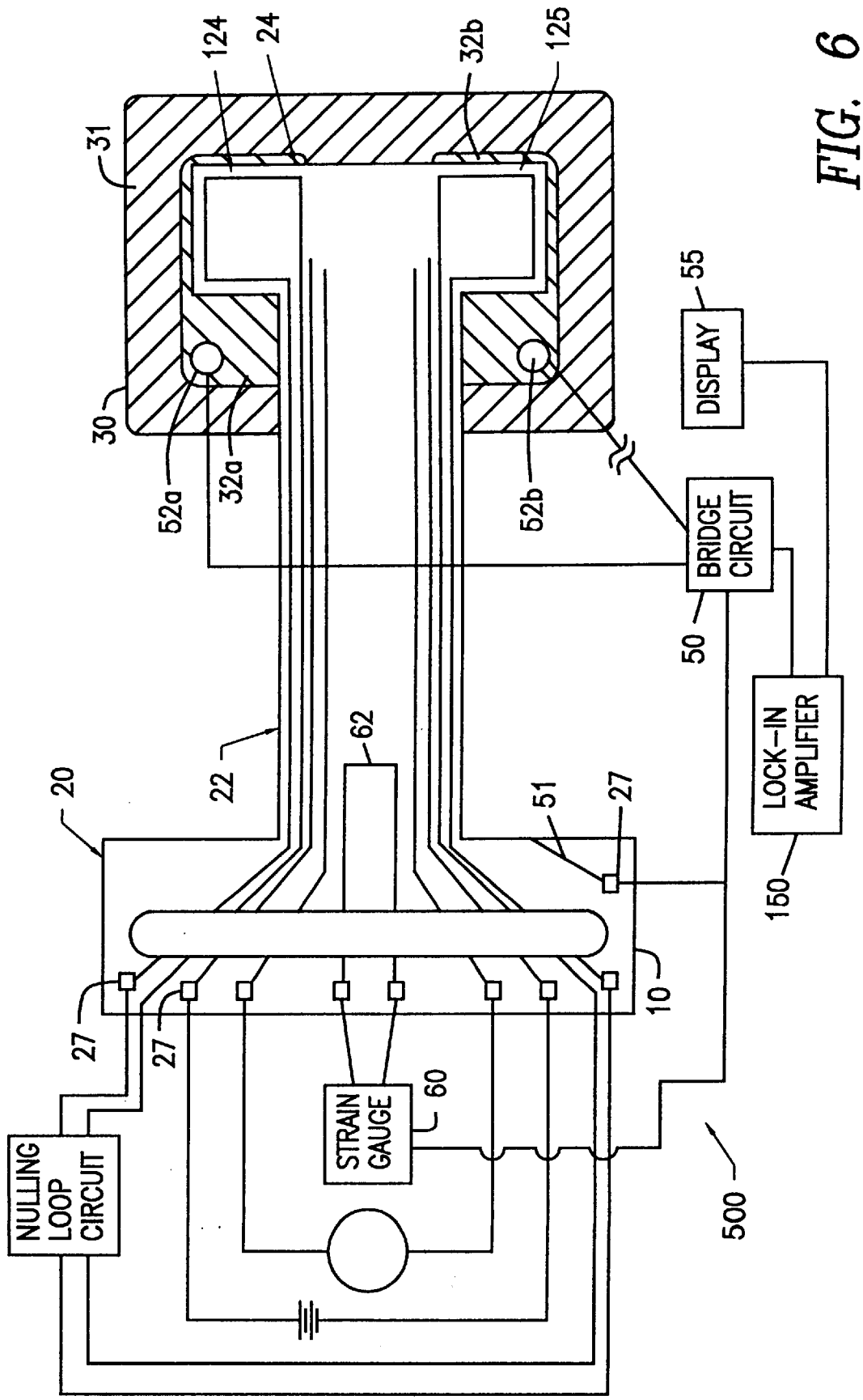
FIG. 6 is an electromechanical schematic top plan view of a second embodiment of the cantilever.
Figure 7:
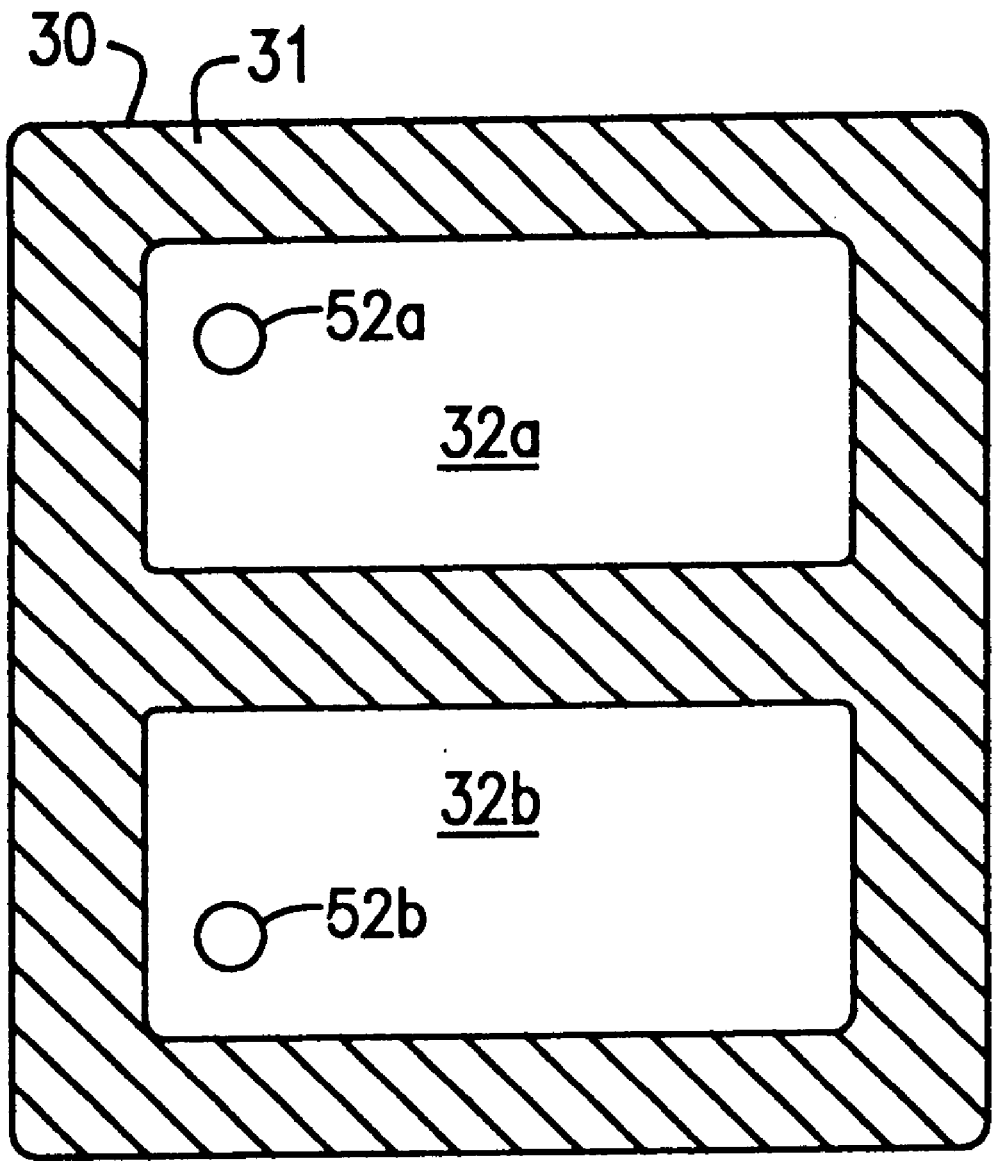
FIG. 7 is a top plan view of the bottom capacitance plate of FIG. 6.

FIGS. 6 and 7 show an alternate embodiment of the cantilever in which the metallized plate 32 is provided as two electrically isolated plates 32a, 32b (best shown in FIG. 7). One plate 32a, 32b is provided beneath each side, or wing 124, 125 of the measurement platform 24. The bottom of cantilever 10 is the same as in FIG. 4, with electrode leads 19 connected to bus 35 and lead 51. Connector lead 51 and metallized plate connectors 52a, 52b are all electrically connected to bridge circuit 50 to sense a differential capacitance between each set of metallized plates 32a, 32b and electrode leades 19

The differential capacitance sensed from the metallized plates 32a, 32b and electrode leads 19 generated beneath each wing 124, 125, permits greater accuracy in the detection of deflections of the cantilever wings 124, 125 toward one plate 32a, 32b and away from the other plate 32b, 32a. One such instance is where the acoustic signal generates a rotational vibration about an axis through the center of the cantilever platform 24 and neck 22.

Alternatively, as before, the strain gauge 62 can also be used to detect this twisting or flexion motion in the cantilever platform 24 in the section of the strain gauge 62 perpendicular to the axis of rotation or flexion.

Figure 2:
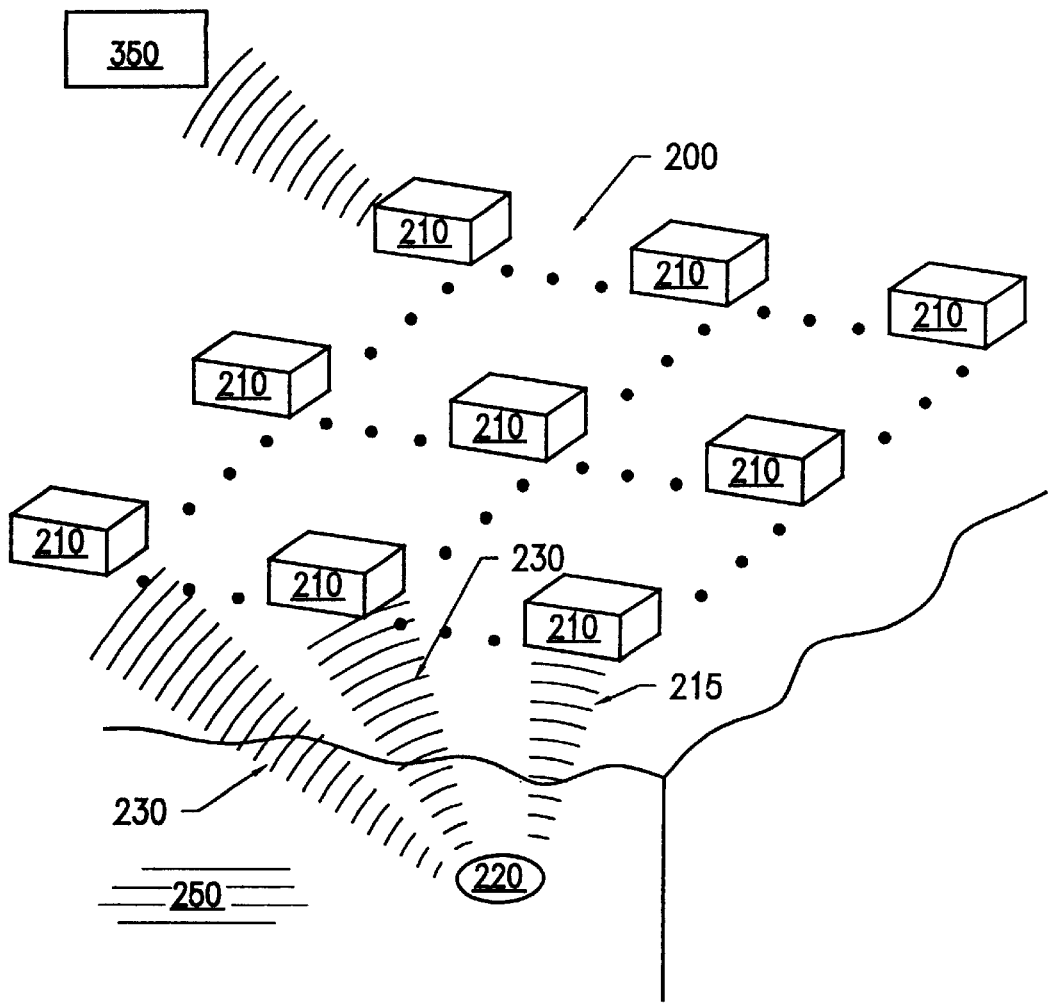
FIG. 2 is a perspective schematic view of a microelectromechanical sensor array according to the invention.
Figure 3:
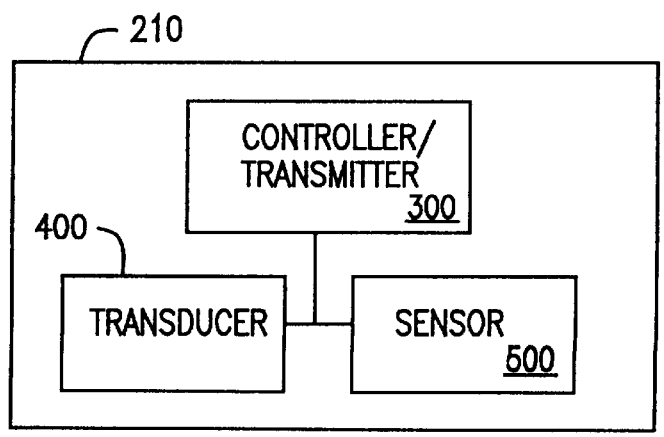
FIG. 3 is a schematic diagram of a sensor and transducer arrangement according to the invention.

Turning back to FIG. 2, an array 200 of sensors 210 is schematically illustrated. Each sensor 210 has a microelectromechanical sensor 500, such as that of FIGS. 5 or 6, that can be used to detect and triangulate the object 220 reflecting acoustic signals 230. FIG. 3 shows a schematic of one sensor 210 configuration. The sensors 210 in the array 200 may be spread over the surface of the ground 250, as seen in FIG. 2.

In operation, first a test signal 215 of known frequency content is generated, such as by transducer 400, and transmitted through the ground in a region suspected of having a buried object 220 of interest. The transducer 400 may be incorporated in one or more of the sensors 210 or it may be a separate device, such as a stand-alone transducer (not shown).

Then, each sensor 210 in the array 200 is used to independently detect a reflected acoustic signal 230 reflected from the buried object 220. The reflected acoustic signal 230 is detected by one or more of the sensors 210, as seen in the schematic of FIG. 3.

As shown in FIG. 3, the microelectromechanical sensors 210 have a microelectromechanical sensor 500 composed of cantilever 10, metallized plate 30 and electrical connections such as shown in FIGS. 5 and 6. A controller/transmitter 300 may be present to control transducer 400 and interpret the capacitance changes generated in microelectromechanical sensor 500, as well as display the data or transmit the data to a remote location 350 (as seen in FIG. 2) for analysis.

When a reflected acoustic signal 230 is detected by one or more of the sensors 210, the cantilever 10 inside the sensor generates a capacitance or piezoresistive change, depending on the mode of operation selected, which is then measured and interpreted and/or transmitted to a remote location, such as an airborne or mobile computer, for analysis.

By comparing the relative strengths of reflected signals and the presence or absence of particular frequencies detected by each sensor 210, objects 220 having different densities than the surrounding earth may be detected using triangulation techniques.

Figure 8:
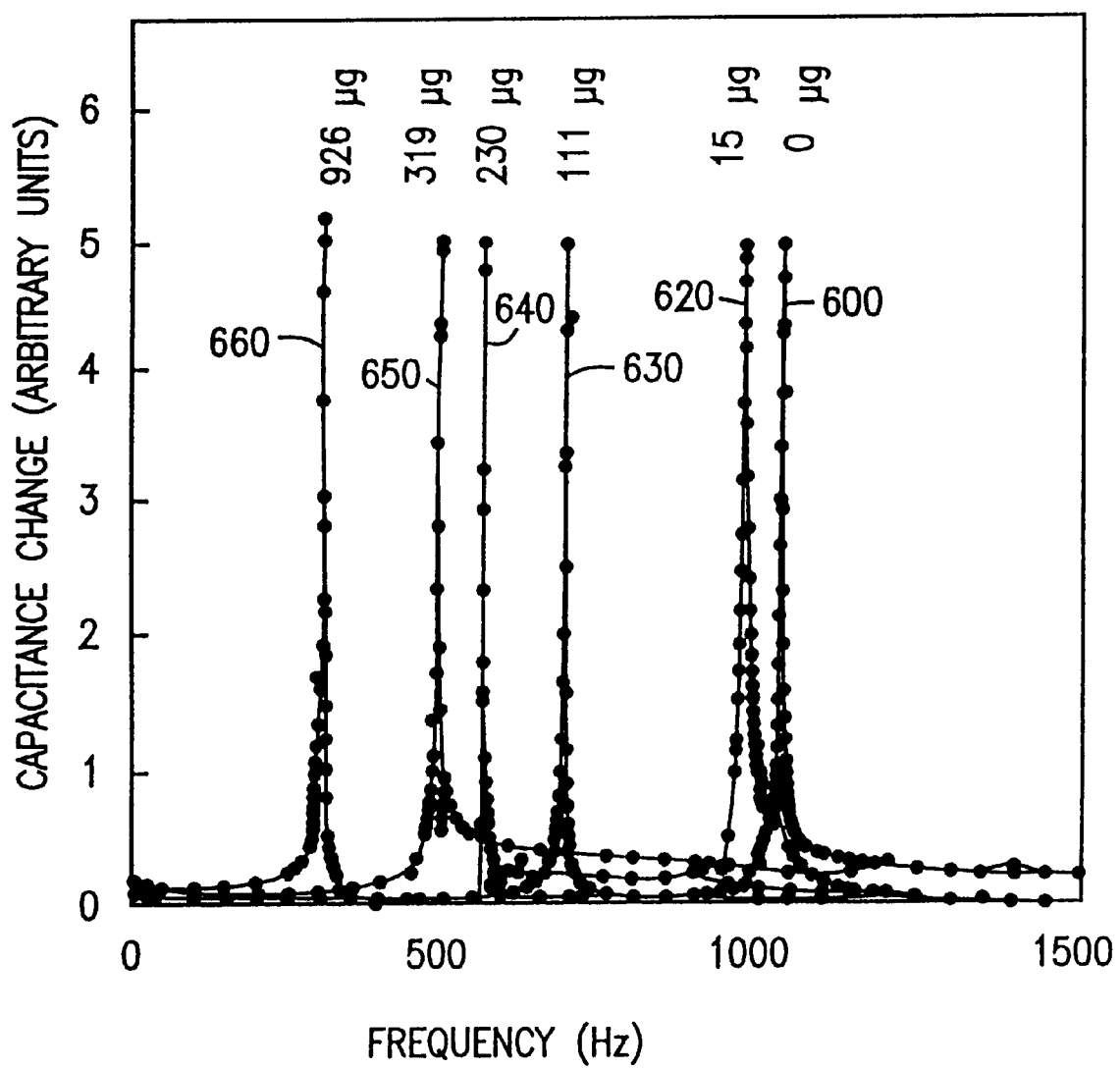
FIG. 8 is a graph plotting the sensitivity of one microelectromechanical sensor cantilever to different frequencies in the acoustic range as showing capacitance change versus frequency in Hertz at different mass loads.
Figure 9:
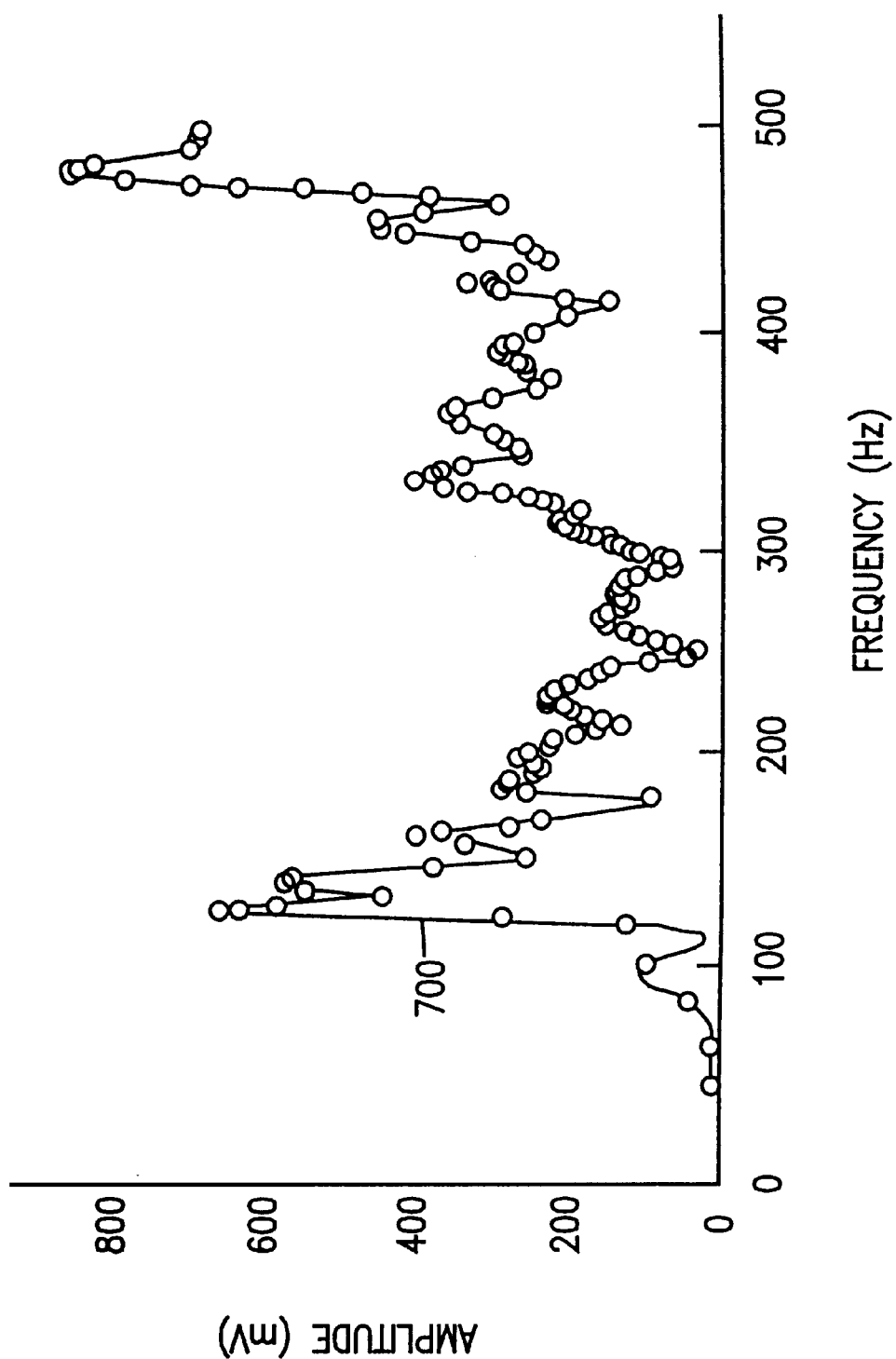
FIG. 9 is a graph plotting capacitance change in millivolts versus acoustic signals in Hertz detected by a microelectromechanical sensor of the invention.

FIGS. 8 and 9 show graphically the response of a microelectromechanical sensor 500 according to the invention and how the response may be affected by changes in a physical property of the cantilever 10.

To generate the curves 600, 660, 620, 630, 640 and 650 of FIG. 8, a cantilever 10 having width of 5 mm, length of 8 mm and measurement platform 24 thickness of 5 microns was exposed to acoustic signals of discrete frequencies. The relative capacitance change in units of an arbitrary scale measured in the sensor by an acoustic signal at each frequency was plotted at each sampled acoustic signal frequency between 0 Hz and 1500 Hz in FIG. 8 in an unloaded condition. Curve 600 shows that a peak sensitivity of the unloaded sensor occurs at about 1050 Hz.

Then, mass was added to the cantilever measurement platform 24 and the sampling process was repeated for loads having masses of 15 μg, 111 μg, 230 μg, 319 μg and 926 μg. The resulting curves 620, 630, 640, 650, 660 show how the peak sensitivity frequency is progressively decreased to about 350 Hz for the 926 μg mass load. The use of mass loads to alter the sensitivity of the cantilever 10 permits the use of a single cantilever 10 which can be calibrated for use in detection of a particular acoustic signal or range of signals, rather than requiring a differently dimensioned cantilever 10 to be produced for each desired frequency sensitivity.

As an example of how the sensor 500 may be used, the data displayed in the graph of FIG. 9, was obtained by first burying the microelectromechanical sensor 500 12 cm deep in a sand bed and exposing it to discrete frequency acoustic signals of constant amplitude using a signal generator. The lock-in amplifier 150 was used to select particular frequencies for measurement. The relative amplitude of the signal received by the microelectromechanical sensor 500 was displayed in terms of voltage in millivolts needed to balance the bridge circuit 50. The results are plotted as curve 700 of FIG. 9 as amplitude in millivolts against the acoustic signal frequency in Hertz. The peak responses were obtained at frequencies of about 125 Hz and 475 Hz.

The results obtained in FIG. 9 show that acoustic signals can be made to propagate through sand or soil and confirm that the cantilever 10 of the microelectromechanical sensor 500 is sensitive to particular frequencies.

Thus, the size, mass and shape of the cantilever 10 may be varied, so that it is more or less sensitive to acoustic signals at particular frequencies. When several tuned microelectromechanical sensors 500 are used in conjunction in an array 200, objects which are known to reflect or absorb a particular acoustic frequency can be detected by the change or lack of change in capacitance experienced by each microelectromechanical sensor 500.

The change in piezoresistance exhibited by the strain loop 62 on the cantilever 10 may be measured in the same manner as the capacitance change. The lock-in amplifier 150 may be used with bridge circuit 50 operating as a resistance bridge to select particular frequencies in the strain loop current generated by the changing resistance of the piezoactive material due to oscillations of the cantilever 10 in response to an acoustic signal. Changing the physical properties of the cantilever 10 will affect the piezoresistance measurements and sensitivity in the same manner as the capacitance measurements.

While a specific embodiment of the invention has been shown and described in detail to illustrate the application of the principles of the invention, it will be understood that the invention may be embodied otherwise without departing from such principles.

What is claimed is:

1. A microelectromechanical acoustic sensor for detecting acoustic signals, the sensor comprising:

cantilever means for generating a complex electrical signal consisting of DC and AC components from physical oscillations in the presence of the acoustic signals and corresponding to amplitudes of the acoustic signals;

a lock-in amplifier in communication with the cantilever means for selectively sampling specific frequencies in the complex electrical signal; and wherein the cantilever means comprises a dielectric substrate having a planar top surface and a planar bottom surface, a measurement platform, an elongated neck, and a base, the elongated neck connecting the base and the measurement platform and forming a cantilever; a coating of an electrical insulating material on the planar top surface; a first conducting layer deposited or etched on to the planar bottom surface, for forming an upper capacitor plate; a metallized plate forming a lower capacitor plate and positioned spaced apart in close proximity to the upper capacitor plate to form a capacitance gap therebetween; and a bridge circuit electrically connected to the upper and lower capacitor plates and in communication with the lock-in amplifier.

2. A microelectromechanical acoustic sensor according to claim 1, wherein the cantilever has a peak sensitivity at an acoustic signal frequency of about 1050 Hz.

3. A microelectromechanical acoustic sensor according to claim 1, wherein a width of the cantilever is about 5 mm, a length of the cantilever is about 8 mm and a thickness of the measurement platform is about 5 microns.

4. A microelectromechanical acoustic sensor for detecting acoustic signals, the sensor comprising:

cantilever means for generating a complex electrical signal consisting of DC and AC components from physical oscillations in the presence of the acoustic signals and corresponding to amplitudes of the acoustic signals; and a lock-in amplifier in communication with the cantilever means for selectively sampling specific frequencies in the complex electrical signal; and wherein the cantilever means comprises a dielectric substrate having a planar top surface and a planar bottom surface, a measurement platform, an elongated neck, and a base, the elongated neck connecting the base and the measurement platform; a coating of an electrical insulating material on the planar top surface; a layer of piezoactive sensitive material deposited or etched on to the planar top surface forming a loop; and strain gauge means for providing a current and measuring a resistance generated in the loop, the strain gauge being in communication with the lock-in amplifier.

5. A sensor array for detecting buried objects using acoustic signals comprising a plurality of microelectromechanical acoustic sensors arranged in spaced apart relation, each microelectromechanical acoustic sensor having cantilever sensor means sensitive to acoustic signals for generating a complex electrical signal from a physical oscillation corresponding to the amplitude of the acoustic signals; and at least one lock-in amplifier in communication with each of the microelectromechanical sensors for selecting discrete frequencies from the complex electrical signal;

wherein each cantilever sensor means comprises cantilever capacitance means for generating a change in capacitance in the presence of the acoustic signals and corresponding to amplitudes of the acoustic signals; and a bridge circuit electrically connected to the cantilever capacitance means and at least one lock-in amplifier for measuring the change in capacitance.

6. A sensor array according to claim 5, further comprising measurement means for quantifying the amplitudes of the complex electrical signal at selected discrete frequencies.

7. A sensor array according to claim 6, further comprising display means for displaying the amplitudes quantified by the measurement means.

8. A sensor array according to claim 5, wherein at least one of the microelectromechanical acoustic sensors includes a transducer.

9. A sensor array according to claim 5, wherein the microelectromechanical acoustic sensors further comprise means for transmitting at least selected discrete frequencies of the complex electrical signal to measurement and display means for measuring an amplitude of the selected discrete frequencies and displaying the amplitude.

10. A sensor array according to claim 5, wherein the cantilever capacitance means comprises a dielectric substrate having a planar top surface and a planar bottom surface, a measurement platform, an elongated neck, and a base, the elongated neck connecting the base and the measurement platform; a coating of an electrical insulating material on the planar top surface; a first conducting layer deposited or etched on to the planar bottom surface, for forming an upper capacitor plate; and a metallized plate forming a lower capacitor plate and positioned spaced apart in close proximity to the upper capacitor plate to form a capacitance gap therebetween, the bridge circuit being electrically connected to the upper and lower capacitor plates.

11. A sensor array for detecting buried objects using acoustic signals comprising a plurality of microelectromechanical acoustic sensors arranged in spaced apart relation, each microelectromechanical acoustic sensor having cantilever sensor means sensitive to acoustic signals for generating a complex electrical signal from a physical oscillation corresponding to the amplitude of the acoustic signals; and at least one lock-in amplifier in communication with each of the microelectromechanical sensors for selecting discrete frequencies from the complex electrical signal;

wherein the cantilever means comprises a dielectric substrate having a planar top surface and a planar bottom surface, a measurement platform, an elongated neck, and a base, the elongated neck connecting the base and the measurement platform; a coating of an electrical insulating material on the planar top surface; a layer of piezoactive sensitive material deposited or etched on to the planar top surface forming a loop; and strain gauge means for providing a current and measuring a resistance generated in the loop, the strain gauge being in communication with the-lock-in amplifier.

* * * * *